US007009871B1

(12) United States Patent
Kawasumi

(10) Patent No.: US 7,009,871 B1
(45) Date of Patent: Mar. 7, 2006

(54) STABLE MEMORY CELL

(75) Inventor: Atsushi Kawasumi, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/920,849

(22) Filed: Aug. 18, 2004

(51) Int. Cl.
*G11C 11/00* (2006.01)

(52) U.S. Cl. .................. 365/154; 365/194; 365/189.04

(58) Field of Classification Search ................ 365/154, 365/194, 189.04, 189.11; 257/391
See application file for complete search history.

(56) References Cited

U.S. PATENT DOCUMENTS

| | | | | |
|---|---|---|---|---|
| 5,053,996 | A * | 10/1991 | Slemmer | 365/156 |
| 5,547,893 | A * | 8/1996 | Sung | 438/207 |
| 6,122,214 | A * | 9/2000 | Fujimoto et al. | 365/222 |
| 6,473,334 | B1 | 10/2002 | Bailey et al. | |
| 6,888,202 | B1 * | 5/2005 | Kang et al. | 257/391 |
| 2002/0020886 | A1 * | 2/2002 | Rockett | 257/369 |

FOREIGN PATENT DOCUMENTS

| | | |
|---|---|---|
| JP | 6-291282 | 10/1994 |
| JP | 283782 | 7/1999 |

OTHER PUBLICATIONS

Bernstein et al;SOI circuit Design Concepts; Chapter 8.7; Kluwer Academic Publishers.

* cited by examiner

*Primary Examiner*—Anh Phung
*Assistant Examiner*—Dang T. Nguyen
(74) *Attorney, Agent, or Firm*—Law Offices of Mark L. Berrier; Mark L. Berrier

(57) ABSTRACT

Systems and methods for improving the stability of memory cells. One embodiment comprises an SRAM cell which includes a first data node switchably coupled to a first bit line and a second data node switchably coupled to a second bit line. The SRAM cell is configured to be read by coupling the first data node to the first bit line and coupling the second data node to the second bit line to enable a low voltage at one of the data nodes to pull down the corresponding bit line. One of the bit lines in the memory cell is switchably coupled to a low voltage so that, when the memory cell is read, this bit line is coupled to the low voltage when the voltage at the opposing data node is high and decoupled from the low voltage when the voltage at the opposing data node is low.

28 Claims, 7 Drawing Sheets

STABLE MEMORY CELL

BACKGROUND

1. Field of the Invention

The invention relates generally to the field of electronic circuits and more particularly to designs for SRAM memory cells that provide improved stability in comparison to conventional designs.

2. Related Art

Computer systems and other devices typically need to have means for storing information.

These means may include persistent storage devices for large amounts of data, as well as smaller memory systems for storing data that the computer or other device is currently using. The memory systems for storing currently used data include both read-only memory (ROM) and random access memory (RAM.)

RAM is typically used as the working memory of a device. RAM is used by devices to store data that needs to be accessible by a processor, and also needs to be modifiable. That is, the data can be changed. By contrast, data stored in a ROM cannot be modified, but can only be read. There is a great demand for RAM in computers and other electronic devices because the more RAM a device has, the more data can be readily accessible to the device's processor. For example, in a computer, the availability of more RAM enables the computer to execute more (or larger) software applications without having to swap data between RAM and a persistent storage device, such as a hard disc drive.

There are various different types of RAM. For example, dynamic RAM, or DRAM, has often been used in computers. The "dynamic" aspect of DRAM refers to the fact that DRAM memory cells need to be periodically refreshed in order to maintain the data which is stored in the cells. If the DRAM cells are not refreshed, the data will be lost. Static RAM, or SRAM, is another type of memory that is often used in computers. That "static" aspect of SRAM refers to the fact that SRAM cells do not have to be refreshed in the same manner as DRAM cells.

SRAM memory has a number of advantages over DRAM memory. As noted above, SRAM cells do not have to be refreshed in order to maintain the data that is stored in them. Additionally, SRAM is typically much faster than DRAM. For example, typical SRAM cells may have access times of about less than 1 nanosecond, while DRAM cells may have access times closer to 60 nanoseconds. Further, SRAM memories do not require pauses between accesses, so the cycle time to access SRAM cells is typically much shorter than the cycle time for accessing DRAM cells.

Although it has a number of advantages, SRAM memory also has some disadvantages. For instance, SRAM is typically much more expensive to manufacture than DRAM. Because the cost of SRAM memory is much higher than DRAM, it is common for SRAM memory to be used as a memory cache, while DRAM is used for a processor's main memory.

SRAM memory cells may also be unstable. That is, the data in the cells may actually be corrupted when the cells are read. This problem arises from the fact that SRAM cells are read by coupling the cells to pre-charged bit lines and allowing the cells to pull down these bit lines. In other words, a higher voltage on the bit line is coupled to a lower voltage in the SRAM cell, causing the bit line voltage to drop and the SRAM cell voltage to rise. The voltage drop on the bit line is detected and amplified to provide the data for the associated processor.

The voltage rise in the SRAM cell, however, may corrupt the data stored in the cell. (because the initial, low voltage corresponded to the "0" stored in the cell, and the higher voltage resulting from the access may cause the data to be ambiguous, or even to flip-flop, so that it is now a "1.")

If the transistors that make up the components of the memory cell were exactly identical to each other, the probability that the data in the cell would be corrected in this manner would be relatively low. As a practical matter, however, the transistors are not identical, but instead have slight variations that cause them to have slight variations in their respective responses. For example, each transistor has an associated threshold voltage that affects the response of the transistor. Because of manufacturing differences between the transistors, there is a variation in these threshold voltages that, in turn, results in a variation in the transistor's responses. These variations are becoming increasingly significant because the variation in threshold voltages increases as the size of the transistors decreases. Thus, as the memory cells grow smaller, they are more susceptible to the instability problem.

The instability of SRAM cells is obviously problematic. It would clearly be desirable to provide a design for an SRAM cell that is more stable than conventional designs and is therefore less likely to be corrupted when the cell is read.

SUMMARY OF THE INVENTION

One or more of the problems outlined above may be solved by the various embodiments of the invention. Broadly speaking, the invention comprises systems and methods for improving the stability of memory cells.

One embodiment comprises a memory cell in which at least one of a pair of bit lines is switchably coupled to ground so that, when the bit line would normally be pulled down during a read operation, the bit line is coupled to ground and therefore pulled down more strongly, and a data node that is coupled to the bit line is pulled up less strongly. In one embodiment, the memory cell includes a first data node switchably coupled to a first bit line and a second data node switchably coupled to a second bit line, where the memory cell is configured to be read by coupling the first data node to the first bit line and coupling the second data node to the second bit line. This enables a low voltage at one of the data nodes to pull down the corresponding bit line. One of the bit lines in the memory cell is switchably coupled to a low voltage so that, when the memory cell is read, this bit line is coupled to the low voltage when the voltage at the opposing data node is high and decoupled from the low voltage when the voltage at the opposing data node is low.

An alternative embodiment comprises a method including providing a memory cell having two data nodes switchably coupled to corresponding bit lines, where the cell is read by enabling a low voltage at one of the data nodes to pull down the corresponding bit line. The method further includes switchably coupling one of the bit lines to a low voltage and, when the memory cell is read, coupling this bit line to the low voltage if the opposing data node is high and decoupling this bit line from the low voltage if the opposing data node is low.

Numerous additional embodiments are also possible.

The various embodiments of the invention may provide a number of advantages over the prior art. For instance, when a data node is low, the coupling of the corresponding bit line to ground during a read operation reinforces the action of the low voltage at the data node in pulling down the voltage on the bit line. This increases the voltage difference between the two bit lines of the memory cell, making it easier to detect the data stored in the cell. Further, by reinforcing the action of pulling down the voltage on the bit line, the voltage at the data node is pulled up less strongly, so that there is less likelihood that the data stored by the memory cell will be corrupted.

BRIEF DESCRIPTION OF THE DRAWINGS

Other objects and advantages of the invention may become apparent upon reading the following detailed description and upon reference to the accompanying drawings.

Figure 1:
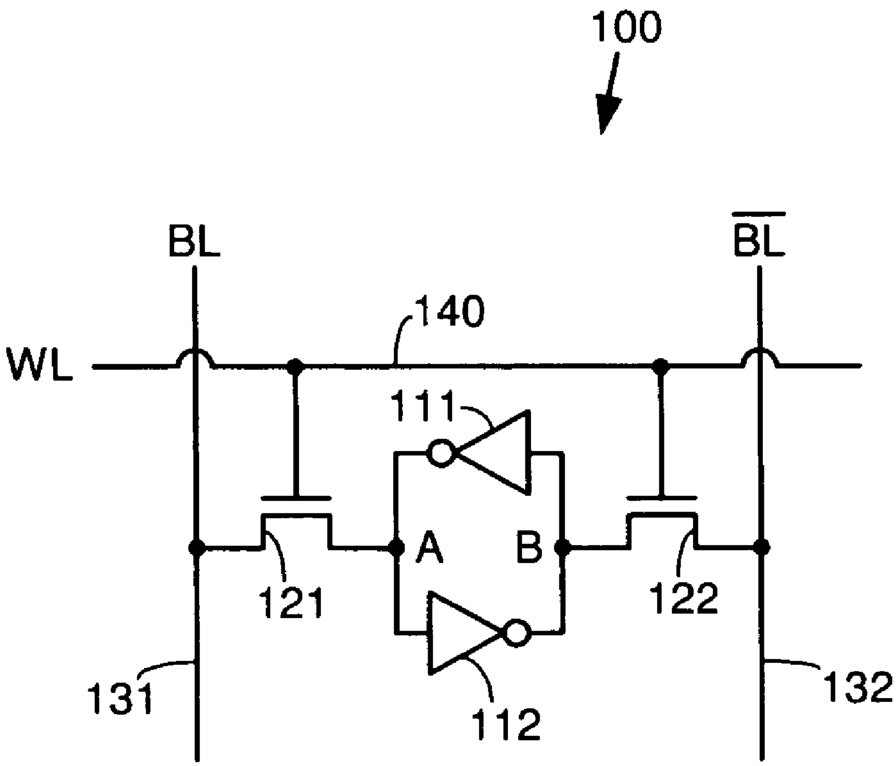
FIG. 1 is a diagram illustrating the structure of a conventional six-transistor SRAM memory cell in accordance with the prior art.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION

One or more embodiments of the invention are described below. It should be noted that these and any other embodiments described below are exemplary and are intended to be illustrative of the invention rather than limiting.

As described herein, various embodiments of the invention comprise systems and methods for improving the stability of memory cells. One embodiment comprises a memory cell in which at least one of a pair of bit lines is switchably coupled to ground so that, when the bit line would normally be pulled down during a read operation, the bit line is coupled to ground and therefore pulled down more strongly, and a data node that is coupled to the bit line is pulled up less strongly.

In one embodiment, a memory cell includes a first data node switchably coupled to a first bit line and a second data node switchably coupled to a second bit line, where the memory cell is configured to be read by coupling the first data node to the first bit line and coupling the second data node to the second bit line. This enables a low voltage at one of the data nodes to pull down the corresponding bit line. One of the bit lines in the memory cell is switchably coupled to a low voltage so that, when the memory cell is read, this bit line is coupled to the low voltage when the voltage at the opposing data node is high and decoupled from the low voltage when the voltage at the opposing data node is low.

The mechanism that couples the bit line to ground may be implemented in many different types of memory cells. For example, as will be described in more detail below, this mechanism may be implemented in a simple, six-transistor SRAM cell. The design of this cell is modified by coupling at least one of the bit lines to ground through a pair of serially configured transistors. The bit line is therefore coupled to ground in both of these transistors are switched on, and decoupled from ground if either of the transistors is switched off.

One of the added transistors has its gate connected to the word line of the SRAM cell. When the voltage on the word line goes high (e.g., during a read operation,) this transistor is switched on. The gate of the other transistor is connected to the data note on the opposing side of the SRAM cell. Thus, this second transistor is switched on when the voltage at the opposing data node is high (and the data node coupled to the bit line is low.) The added transistors therefore pull down the voltage on the bit line when the bit line would normally be either pulled down during a read operation, or driven down during a write operation. The mechanism therefore reinforces the normal operation of the SRAM cell and makes it more stable (i.e., less likely to be corrupted or misread during a read operation.)

As noted above, one embodiment of the invention is implemented in an SRAM cell that is based on a simple, six-transistor SRAM cell that is known in the art. Before describing the invention, it will therefore be helpful to examine the structure of the conventional SRAM memory cell.

The structure of an exemplary SRAM memory cell in accordance with the prior art is illustrated in FIG. 1. Memory cell 100 is an example of one of the most simple SRAM memory cells. Memory cell 100 is formed by six transistors. Two of the transistors, 121 and 122, are explicitly shown in FIG. 1. The other four transistors are embodied in inverters 111 and 112.

Figure 2:
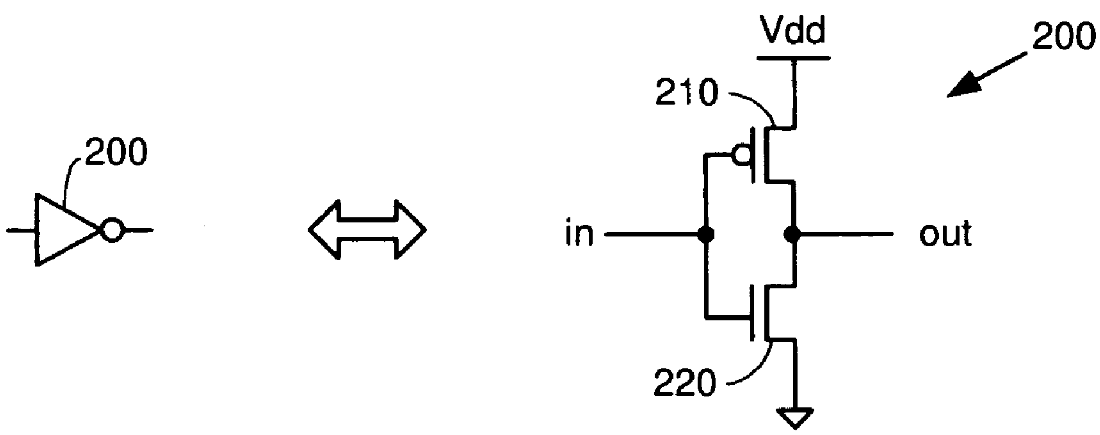
FIG. 2 is a diagram illustrating the structure of one type of inverter that can be used in memory cells as described in the present disclosure.

Referring to FIG. 2, a diagram illustrating the structure of one type of inverter that can be used in the memory cells herein is shown. The symbolic representation of inverter 200 is shown on the left side of the figure, and the transistor-level structure is shown on the right side of the figure. Inverter 200 simply consists of a pair of transistors, one PMOS and one NMOS (210 and 220,) that are coupled in series between a voltage source (Vdd) and ground. The source of transistor 210 is connected to the voltage source, and the drain of transistor 210 is connected to the source of transistor 220. The drain of transistor 220 is connected to ground. The gates of these two transistors are tied together at the input of the inverter. The junction between transistors 210 and 220 is the output of the inverter.

Inverters 111 and 112 are coupled together, front-to-back. That is, the input of each inverter is coupled to the output of the other inverter. The junction between the input of inverter 111 and the output of inverter 112 is identified in FIG. 1 as node A. The junction between the input of inverter 112 and the output of inverter 111 is identified in the figure as node B. These nodes may also be referred to herein as the data nodes of the memory cell. Each of nodes A and B is coupled to a corresponding one of bit lines 131 and 132 via transistors 121 and 122, respectively. The gate of each of these transistors (121 and 122) is coupled to a word line 140.

Transistors 121 and 122 are used to selectively couple or decouple the nodes (A and B) from the corresponding bit lines (131 and 132.) The voltage on word line 140 is transferred to the gates of transistors 121 and 122 to control whether these transistors are switched on or off, thereby coupling or decoupling the nodes from the bit lines. When the signal on word line 140 is low, transistors 121 and 122 are switched off, so that node A is decoupled from bit line 131 and node B is decoupled from bit line 132. When the signal on word line 140 is high, transistors 121 and 122 are switched on, so that node A is coupled to bit line 131 and node B is coupled to bit line 132.

It should be noted that the terms "high" and "low," as used to describe the voltages in the memory cell circuits of the present disclosure, refer to the range of voltages that are interpreted as a binary "1" and "0," respectively. These terms should not be construed to be limited only to Vdd and ground, respectively. These voltages may vary from one circuit design to another, as well be understood by one of skill in the art.

SRAM memory cell 100 operates as follows. When it is desired to store data in memory cell 100, appropriate voltages are applied to bit lines 131 and 132. In one embodiment, bit line 131 is considered the data line, while bit line 132 is considered the inverse data line, so voltages are applied to the lines in accordance with this scheme. In other words, if the data to be stored in memory cell 100 is a "1," the voltage on bit line 131 will be high, while the voltage on bit line 132 will be low. If the data to be stored is a "0," the opposite will be true—the voltage on bit line 131 will be low and the voltage on bit line 132 will be high.

In order to "write" data to memory cell 100, a signal is asserted on word line 140. That is, the voltage on word line 140 will go high. This signal is applied to the gates of transistors 121 and 122, so when the signal is high, current can flow through the transistors. As a result, the voltages at data nodes A and B equalize with the respective ones of bit lines (131 and 132, respectively.) Thus, if bit line 131 is high and inverse bit line 132 is low, the voltage at node A is high, and the voltage at node B is low.

The signal on word line 140 is then deasserted (i.e., the signal goes low.) When this occurs, the voltages applied to the gates of transistors 121 and 122 go low, and the transistors are switched off. This decouples nodes A and B from bit lines 131 and 132. Consequently, current can no longer flow through transistors 121 and 122, so the data nodes (A and B) are electrically isolated from the bit lines. The voltages at the data nodes will therefore be retained, regardless of whether the voltages on bit lines 131 and 132 change.

It should be noted that the voltages retained at nodes A and B may not be exactly the same as the voltages that were on bit lines 131 and 132 when the signal on word line 140 was asserted. This is because inverters 111 and 112 are active devices. In other words, as shown above in FIG. 2, each of these inverters has a pair of transistors that alternately couple the respective outputs to a high voltage or a low voltage, and will drive the voltages at nodes A and B toward these high and low voltages. Thus, even if the voltages on bit lines 131 and 132 were only slightly different during a write operation, the voltages at nodes A and B would be driven to the respective high and low voltages after completion of the write operation (i.e., after the signal on word line 140 is deasserted.)

Memory cell 100 now stores data in the form of high and low voltages at data nodes A and B. In the foregoing example, the voltage at node A is high and the voltage at node B is low, corresponding to a stored "1." When it is desired to read the data out of memory cell 100, a read operation is performed. The read operation is very similar to the write operation, except that, rather than driving the voltages on bit lines 131 and 132 so that these voltages can be stored in the circuit out of memory cell 100, the bit lines are monitored to detect voltage changes that occur when they are coupled to data nodes A and B. this will be explained in more detail below.

In order to perform a read operation, the voltage on word line 140 is initially low. Transistors 121 and 122 are therefore switched off, and data nodes A and B are decoupled from bit lines 131 and 132. Bit lines 131 and 132 are then precharged to a high voltage (i.e., Vdd.) When the signal in word line 140 is asserted (i.e. the voltage on the line goes high,) transistors 121 and 122 are switched on, coupling bit lines 131 and 132 to nodes A and B, respectively.

In the foregoing example, the write operation resulted in a high voltage at node A and a low voltage at node B, corresponding to a stored "1." The voltages at node A and on bit line 131 are therefore approximately the same (i.e., both are at about Vdd.) As a result, little or no current flows through transistor 121, and there is little or no change in the voltage on bit line 121. The voltage at node B, however, was low. Consequently, when transistor 122 is switched on, current flows from the higher voltage (Vdd) on bit line 132 to the lower voltage at node B. Because bit line 132 was only precharged to Vdd, and is not being driven to Vdd, the flow of current through transistor 122 causes the voltage on bit line 132 to drop. While this voltage drop may not be substantial, it is enough that a difference can be detected between this voltage and the voltage on bit line 131.

Bit lines 131 and 132 can be coupled to a sense amplifier that is configured to detect and amplify this voltage difference. Typically, the sense amplifier is designed to provide a high voltage (Vdd) on a data line corresponding to the higher of the two bit lines, and a low voltage (ground) on a data line corresponding to the lower of the two bit lines. A very small voltage difference between the bit lines is thereby amplify to the normal voltage difference (approximately Vdd) of a binary signal in the system in which the memory cell is implemented.

As noted above, SRAM memory cells may become unstable when they are read. The reason for this instability is that, when transistors 121 and 122 are switched on, and current is allowed to flow from one of the bit lines to the lower-voltage data node, this not only causes the voltage on the bit line to drop, but also causes the voltage at the data node to rise. Thus, before the read operation begins, bit line 132 is at Vdd, while data node B is at ground. When the signal on word line 140 is asserted, the voltage on bit line 132 drops below Vdd and the voltage at node B rises above ground.

In a perfect memory cell, where all of the components of the memory cell are perfectly matched, this increase in the voltage at the data node is not likely to have any substantial effect on the memory cell. When the signal on the word line is deasserted, the data node would be decoupled from the bit line and the voltage at the data node would be driven back to ground.

Actual memory cells, however, are not perfect. As a practical matter, the transistors that form the memory cell may have variations in their respective responses that cause them not to be perfectly matched. For example, there is typically some variation from one transistor to another in the threshold voltages of the transistors. This is true, even when the transistors are identical in design. Such variations may, in combination with other factors, cause memory cells to malfunction.

Referring again to the memory cell shown in FIG. 1, circuit 100 has three symmetrically arranged pairs of transistors (transistors 121 and 122, and the two transistors in each of inverters 111 and 112.) Transfer transistors 121 and 122, for example, may have different threshold voltages. These differences in threshold voltages may cause one of these transistors to turn on more strongly than the other. If the transistor that turns on more strongly is connected to the data node that has the low voltage, current to will readily flow through this transistor and will cause the voltage at the data node to increase more than if the transistor turned on more weakly. As noted above, the voltage may increase sufficiently to cause the data to be inverted after the read operation. In other words, the low voltage will go high, and the high voltage will go low.

Alternatively, the transistor connected to the node that holds the "0" value (the low voltage) may turn on more weakly than the other transistor. In this case, less current flows through the transistor. As a result, the voltage of the data node will not increase as much as if the transistor turned on more strongly, and the memory cell will be less likely to invert the stored data. This may, however, cause another problem. Just as the data node voltage increases less when the transistor turns on weakly, the voltage on the bit line will drop less than when the transistor is turned on strongly. Consequently, there is less of a voltage difference between the two bit lines. The voltage difference may therefore be insufficient to be accurately detected and amplified by the sense amplifier, causing it to malfunction.

As noted above, the instability of the SRAM memory cells is due, at least in part, to the variations in the threshold voltages of the different transistors. The problem is aggravated by the drive to decrease the size of electronic components such as memory cells. This is due to the fact that the variation in threshold voltages increases as the area of the channels in the individual transistors decreases. More specifically, the variation in threshold voltages is proportional to the inverse of the square root of the channel area:

$$\Delta Vth\alpha 1/(w*L)**1/2$$

Thus, as the size of SRAM cells decreases, the cells become more unstable and more susceptible to malfunctions, as described above.

The various embodiments of the invention are intended to increase the stability of SRAM memory cells, so that they are less likely to malfunction, even as the size of the cells decreases and the variation in threshold voltages of the transistors within the cells increases. This is achieved with relatively minor increases in the complexity of the memory cells, and relatively small increases in the size of the cells.

Figure 3:
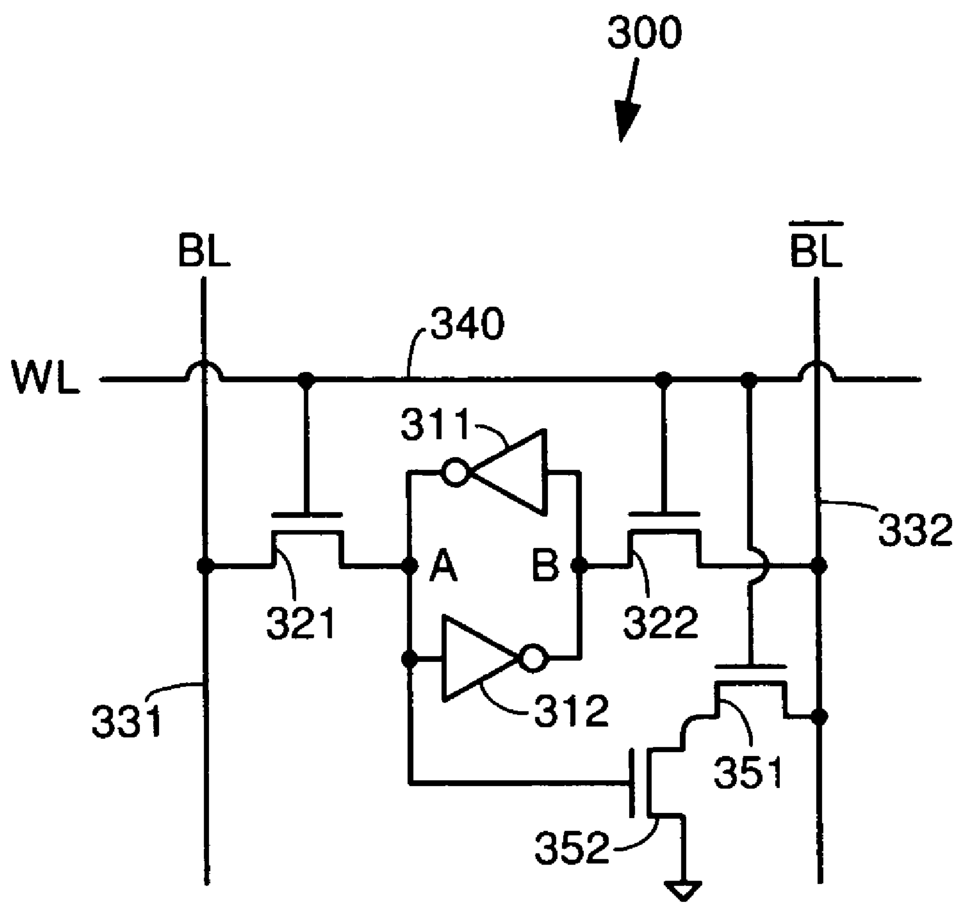
FIG. 3 is a diagram illustrating the structure of an SRAM memory cell that implements a one-sided, switchable bit-line-to-ground coupling mechanism in accordance with one embodiment.

One embodiment of the invention is based on the simple, six-transistor SRAM cell shown in FIG. 1. This basic design is modified as shown in FIG. 3. SRAM memory cell 300, which is depicted in FIG. 3, includes eight transistors, including the four transistors that make up inverters 311 and 312, transfer transistors 321 and 322, and two additional transistors, 351 and 352. These additional transistors are configured to switchably couple (i.e., alternately couple or decouple) one of the bit lines to ground.

Inverters 311 and 312 are coupled together by tying the input of each inverter to the output of the other inverter. The inverters are tied together at nodes that are referred to herein as the data nodes. The voltages at these nodes define the value stored by the SRAM cell. The voltage at one of the data nodes will be high (e.g., Vdd) and the voltage at one of the nodes will be low (e.g., ground.) One of the data nodes is identified in the figure as node A, while the other is identified as node B. Each of data nodes A and B is coupled to a corresponding one of bit lines 331 and 332 through a transistor (321 or 322.) The source of the transistor is coupled to the bit line, while the drain of the transistors coupled to the data node. The gate of each of transistors 321 and 322 is connected to word line 340.

SRAM memory cell 300 also includes a pair of additional transistors, 351 and 352. Transistors 351 and 352 are serially coupled between bit line 332 and ground. In other words, the source of transistor 351 is connected to bit line 332, while its drain is connected to the source of transistor 352. The drain of transistor 352 is then connected to ground. The gate of transistor 351 is connected to word line 340. The gate of transistor 352 is connected to data node A.

SRAM cell 300 is used in the same manner as cell 100. When it is desired to store data in the memory cell, high and low voltages are applied to bit lines 331 and 332 in accordance with the data bit to be stored (i.e., to store a "1," bit line 331 is high and bit line 332 is low—to store a "0," bit line 331 is low and bit line 332 is high.) The signal on word line 340 is then asserted to transfer these voltages to data nodes A and B. The signal on word line 340 is then deasserted. When it is desired to read data from memory cell 300, bit lines 331 and 332 are precharged to Vdd, then the signal on word line 340 is asserted. The bit line corresponding to the data node that is low is then pulled down slightly, and the difference between the voltages on the bit lines is detected and amplified. The additional transistors, 351 and 352, in the design of SRAM cell 300 do not change this basic mode of operation. These transistors do, however, serve to both reinforce the pull-down of the bit line during the read operation and lessen the pull-up of the data node voltage.

As described above, additional transistors 351 and 352 are serially coupled between bit line 332 and ground. If both of these transistors are switched on, current is allowed to flow through them, so that the voltage on bit line 332 is pulled toward ground. If either of transistors 351 or 352 is switched off, bit line 332 is decoupled from ground. That is, current cannot flow from bit line 332 through the transistors to ground.

At the beginning of a read operation, the voltage on word line 340 is low. This voltage is applied to the gates of transistors 321, 322 and 351, so that these transistors are all switched off. Bit lines 331 and 332 are then pre-charged to Vdd. When the voltage on word line 340 goes high, transferred transistors 321 and 322 are switched on, as in memory cell 100. Additional transistor 351 is also switched on. Additional transistor 352 may or may not be switched on, depending upon the value that is stored in memory cell 300 (since the voltage at data node A is applied to the gate of transistor 352.)

If memory cell 300 stores a "1," the voltage at node A is high, and the voltage at node B is low. Transistor 352 will therefore be switched on. As a result, when the signal on word line 340 is asserted, current will be allowed to flow through transistors 351 and 352 to ground. This will cause the voltage on bit line 332 to be pulled down, toward ground. This reinforces the effect of the bit line being pulled down by current flowing through transistor 322 to node B. Thus, the pull-down of bit line 332 is reinforced. Additionally, because the voltage on bit line 332 is being pulled down through transistors 351 and 352, less current flows through transistor 322 than in the absence of additional transistors 351 and 352. Consequently, the low voltage at node B is pulled up to a lesser extent than in conventional cell 100. When the signal on word line 340 is deasserted at the end of the read operation, transistors 321, 322 and 351 are switched off, and the voltages at data nodes A and B are driven to their normal, binary levels.

If, the other hand SRAM cell 300 stores a "0," the voltage at node A is low, and the voltage at node B is high. Because the voltage at node A is low, additional transistor 352 is switched off. Bit line 332 is thereby decoupled from ground, regardless of whether transistor 351 is switched on or off. Thus, during the read operation, bit line 332 remains at the precharge voltage (Vdd,) since it is not being pulled down, either by additional transistors 351 and 352, or by the high voltage at node B through transistor 322. The voltage on bit line 331, however, is pulled down by current flowing through transistor 321 to node A, which is at a low voltage. This is equivalent to the operation of memory cell 100.

It is apparent from the description of SRAM cell 300 above that additional transistors 351 and 352 can alleviate two of the problems described above: the possible inability to pull down the voltage on bit line 332 by a sufficient amount to ensure accurate detection of the data stored in the memory cell; and the possible corruption of the data if the voltage at node B is pulled up too much. It is apparent that these problems apply to the situation in which SRAM cell 300 stores a "1." If cell 300 stores a "0," the mechanism provided by additional transistors 351 and 352 is disabled (because the voltage at node A is low and transistor 352 is switched off.) This embodiment therefore does not minimize these two problems they relate to the other side of SRAM cell 300. In other words, if the low voltage at node A is pulled up too much, the data may still be corrupted, and if the voltage on bit line 331 is not pulled down enough, the data may not be correctly detected and amplified. Therefore, in an alternative embodiment, the mechanism of additional transistors 351 and 352 is implemented on both sides of the memory cell.

Figure 4:
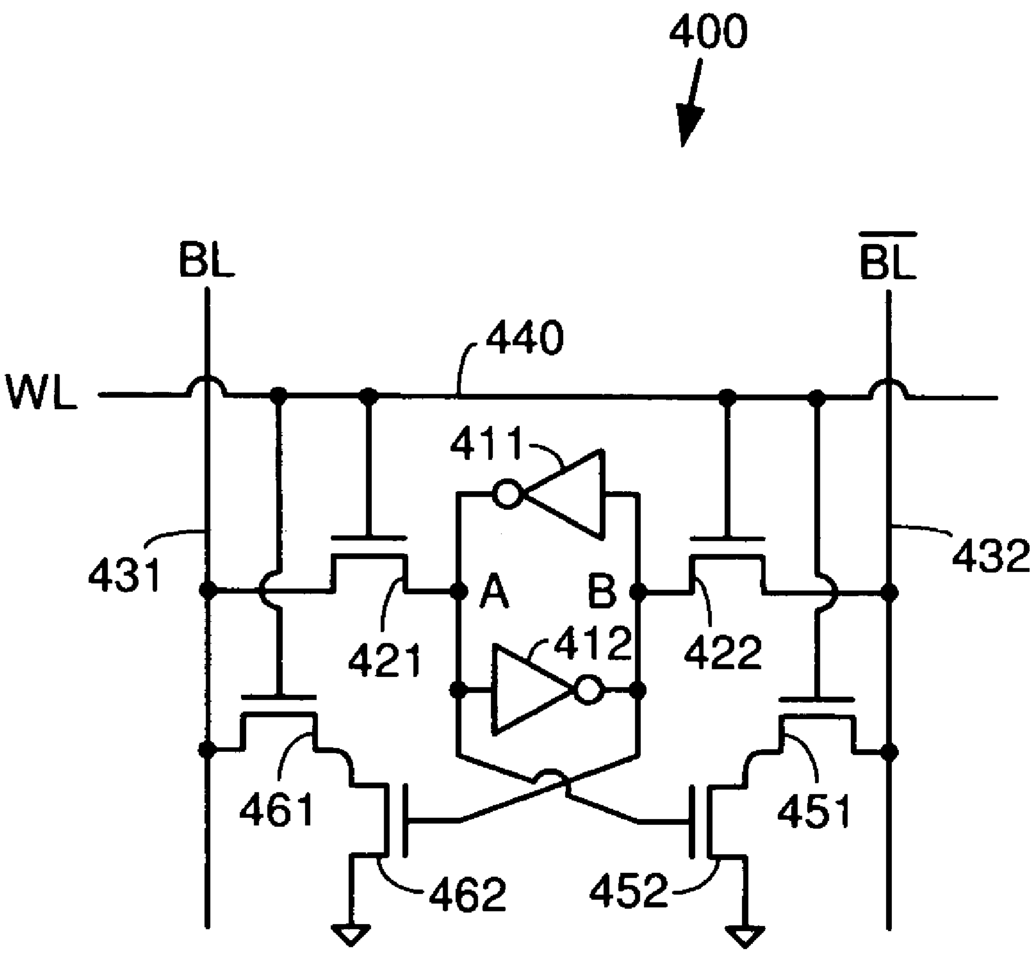
FIG. 4 is a diagram illustrating the structure of an SRAM memory cell that implements a two-sided, switchable bit-line-to-ground coupling mechanism in accordance with one embodiment.

Referring to FIG. 4, a diagram illustrating an alternative embodiment in which this mechanism is applied to both sides of an SRAM memory cell is shown. As depicted in FIG. 4, the basic structure of memory cell 400 is essentially the same as that of memory cells 100 and 300. Thus, there is a pair of inverters, 411 and 412, which are coupled front-to-back at data nodes A and B. Data nodes A and B are coupled to bit lines 431 and 432, respectively, through corresponding transfer transistors 421 and 422. The gates of transistors 421 and 422 are coupled to word line 440.

SRAM cell 400 then adds a switchable bit-line-to-ground coupling mechanism on each side of the cell. On one side, this mechanism is identical to the mechanism implemented in memory cell 300. Thus, bit line 432 is coupled to ground through serially configured transistors 451 and 452. The gate of transistor 451 is connected to word line 440 so that it is switched on when the voltage on word line 440 is high and switched off when the voltage on word line 440 is low. The gate of transistor 452 is connected to data node A so that it is switched on when the voltage at this node is high (i.e., when the memory cell stores a "1") and switched off when the voltage at this node is low (i.e., when the memory cell stores a "0.")

SRAM cell 400 also adds an identical structure to the other side of the cell so that the cell is symmetric. Bit line 431 is therefore coupled to ground through a pair of serially connected transistors, 461 and 462. The gate of transistor 461 is connected to word line 440. Transistor 461 is therefore switched line when the voltage on word line 440 is high and switched off when the voltage on word line 440 is low. The gate of transistor 462 is connected to data node B, and is therefore switched on when the voltage at node B is high (corresponding to a "0" stored in the memory cell) and switched off when the voltage at node B is low (corresponding to a "1" stored in the cell.)

SRAM cell 400 is accessed in the same manner as cells 100 and 300. Thus, during a write operation, voltages corresponding to the data are applied to bit lines 431 and 432, then the signal on word line 440 is asserted to pull data nodes A and B to the corresponding voltages, and then the signal on word line 440 is deasserted to decouple the data nodes from the bit lines. During a read operation, bit lines 431 and 432 are precharged to Vdd, then the signal on word line 440 is asserted, then the voltage drop on one of the bit lines is detected, and the signal on word line 440 is deasserted to once more isolate the data nodes.

The bit-line-to-ground coupling mechanisms improve the stability of memory cell 400 in the same manner as described above in connection with memory cell 300. In other words, during a read operation, if one of the bit lines is coupled to the data note that is at a low voltage, the bit line is pulled down, not only by the low voltage at the data note, but also by the coupling to ground through the additional transistors (since one of the transistors is switched on by the asserted signal on the word line and the other transistor is switched on by the high voltage at the opposing data node.) Further, because the bit line is being pulled down by the coupling to ground, the bit line pulls up less strongly on the data node, so the data stored in the cell is less likely to be corrupted.

The bit-line-to-ground coupling mechanisms of memory cell 400 improves upon the mechanism of memory cell 300, however, in that the operation of both sides of the cell is improved. As explained above, the one-sided mechanism implemented in memory cell 300 is effective when a "1" is stored in the cell, but not when a "0" is stored in the cell. When a "0" is stored in cell 300, the voltage at data node A is low, so transistor 352 is switched off and the bit-line-to-ground coupling mechanism is disabled. In memory cell 400, on the other hand, when a "0" is stored, the voltage at data node B is high, so transistor 462 is switched on, enabling the bit-line-to-ground coupling mechanism on the left side of the memory cell. When memory cell 400 stores a "1," the cell obviously functions in the same manner as cell 300.

Figure 5:
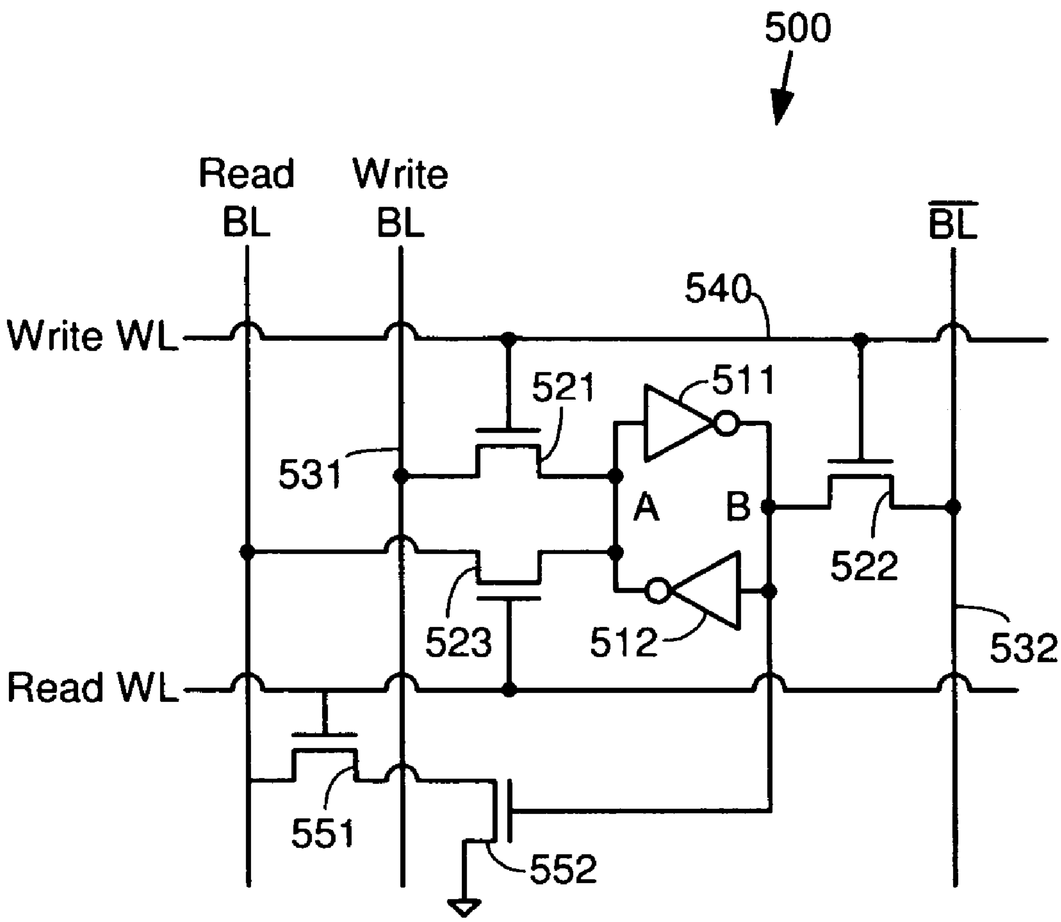
FIG. 5 is a diagram illustrating the structure of a dual-port SRAM memory cell that implements a one-sided, switchable bit-line-to-ground coupling mechanism in accordance with one embodiment.

The bit-line-to-ground coupling mechanism illustrated in SRAM cells 300 and 400 can be implemented in other types of memory cells as well. For instance, another alternative embodiment comprising a dual-port SRAM memory cell is illustrated in FIG. 5. As shown in this figure, memory cell 500 has a one-sided bit-line-to-ground coupling mechanism similar to the mechanism implemented in memory cell 300, but cell 500 has separate read and write bit lines on the left side of the cell and separate read and write word lines.

Referring to FIG. 5, SRAM cell 500 has a pair of converters, 511 and 512 that are coupled together in a front-to-back configuration as a memory cells 100, 300 and 400. The junctions between the inputs and outputs of the inverters form data nodes A and B. Data node B is coupled to inverse bit line 532 via transfer transistor 522. The gate of transistor 522 is coupled to write word line 541.

Data node A is coupled to two separate bit lines, rather than a single bit line, since memory cell 500 is a dual-port cell. Thus, data node A is coupled to write bit line 531 via transfer transistor or 521, and is also coupled to read bit line 533 via transfer transistor 523. Since transistor 521 couples the data node to the write bit line, the gate of this transistor is connected to the write word line, 541. Because transistor 523 couples the data node A to the read bit line, the gate of transistor 523 is connected to the read word line, 543.

The bit-line-to-ground mechanism in SRAM cell 500 again consists of two transistors, 551 and 552, that are coupled serially between the bit line and ground. It should be noted that these transistors are coupled to read bit line 533, rather than write bit line 531. The gate of transistor 551 is connected to read word line 542, while the gate of transistor 552 is connected to data node B.

Read and write operations performed using SRAM cell 500 obviously differ somewhat from the same operations in the previously described memory cells (100, 300 and 400,) since cell 500 is a dual-port memory cell. Specifically, the difference is that different word lines and bit lines are used to write data into node A and read data out of node A. Otherwise, the operations are much the same. To write data into cell 500, high and low voltages are applied to write bit line 531 and inverse bit line 532 in accordance with the data (high on bit line 531 for a "1," and low on this bit line for a "0.") Write word line 541 is then asserted to transfer the voltages on the bit lines (531 and 532) to the data nodes. To read data from cell 500, read bit line 533 is used instead of write bit line 531, and read word line 542 is used instead of a write word line 541. Thus, to read data from the cell, read bit line 533 and inverse bit line 532 are pre-charged to Vdd, then read word line 542 is asserted to pull down one of these bit lines, and to the difference between the voltages on bit lines 533 and 532 is detected and amplified.

The bit-line-to-ground coupling mechanism of SRAM cell 500 comes into play when a "0" is stored in the cell. In this instance, the voltage at data node A is low, and the voltage at data node B is high. The high voltage at node B is applied to the gate of transistor 552, switching it on. Thus, when read word line 542 is asserted during a read operation, read bit line 533 is coupled to ground. This serves to reinforce the pull-down of the bit line, and also to alleviate the pull-up of the voltage at data node A. The bit-line-to-ground coupling mechanism is disabled when a "1" is stored in cell 500 (because the low voltage at data node B switches transistor 552 off.)

Figure 6:
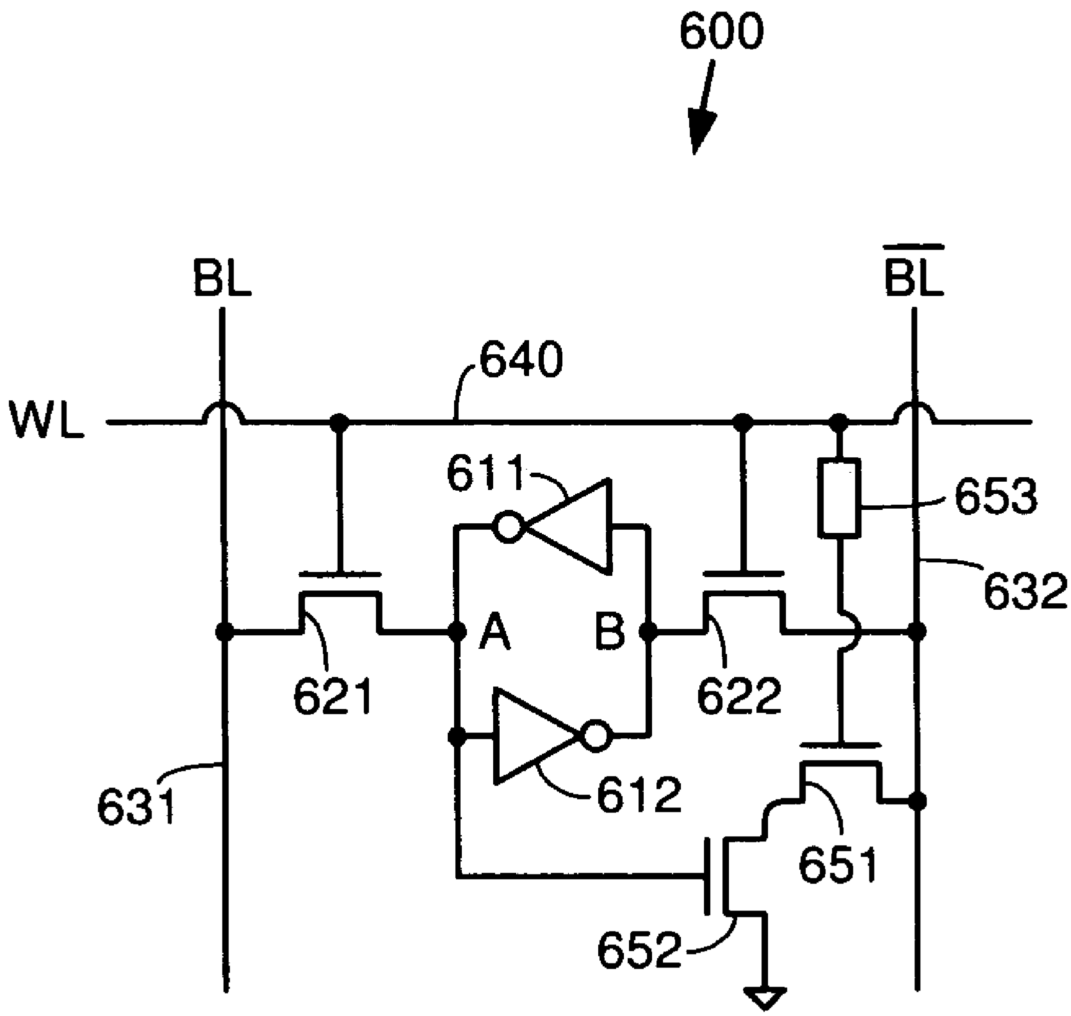
FIG. 6 is a diagram illustrating the structure of an SRAM memory cell that implements a one-sided, switchable bit-line-to-ground coupling mechanism having a delay element in accordance with one embodiment.

Referring to FIG. 6, a diagram illustrating another alternative embodiment for a memory cell is shown. This embodiment is similar in structure to the embodiment of FIG. 3, except that a delay element 653 is added to the circuit. The purpose of delay element 653 is to delay the opening of the path from bit line 632 to ground to allow greater development of the signal difference between the bit lines. The greater signal development makes memory cell 600 more stable.

Inverters 611 and 612 are tied together, front-to-back, at data nodes A and B. Each of data nodes A and B is coupled to a corresponding one of bit lines 631 and 632 through a transistor (621 or 622.) The source of the transistor is coupled to the bit line, while the drain of the transistors coupled to the data node. The gate of each of transistors 621 and 622 is connected to word line 640.

SRAM memory cell 600 also includes a pair of additional transistors, 651 and 652. Transistors 651 and 652 are serially coupled between bit line 632 and ground. In other words, the source of transistor 651 is connected to bit line 632, while its drain is connected to the source of transistor 652. The drain of transistor 652 is then connected to ground. The gate of transistor 651 is connected to word line 640 through delay element 653. Delay element 653 can be any of a variety of different types of delay elements, such as a simple resistor. The gate of transistor 652 is connected to data node A.

SRAM cell 600 is used in the same manner as cell 300. The transistors 651 and 652 serve to both reinforce the pull-down of the bit line during the read operation and lessen the pull-up of the data node voltage, just as in cell 300. Delay element 653, however, delays the reinforcing action of transistors 651 and 652 so that the difference between the signals on bit lines 631 and 632 is greater than if transistor 651 were switched on as soon as the signal on word line 640 is asserted.

Figure 7:
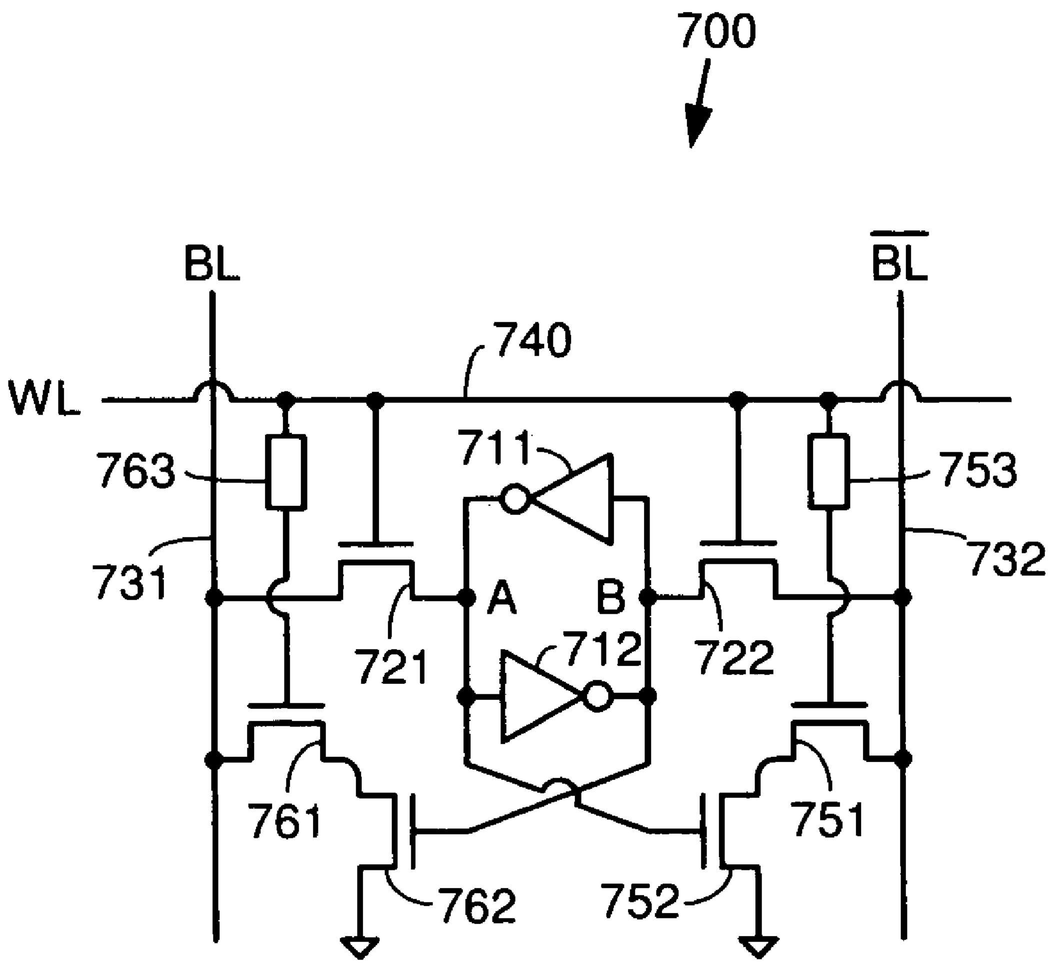
FIG. 7 is a diagram illustrating the structure of an SRAM memory cell that implements a two-sided, switchable bit-line-to-ground coupling mechanism having a delay element in accordance with one embodiment.

Referring to FIG. 7, a diagram illustrating another alternative embodiment for a memory cell is shown. This embodiment is similar in structure to the embodiment of FIG. 4, except that delay elements 753 and 763 are added to the circuit. The purpose of these delay elements is to delay the opening of the paths from bit lines 731 and 732 to ground to allow greater development of the signal difference between the bit lines. The greater signal development makes memory cell 700 more stable. Delay elements 753 and 763 may be any suitable type of delay element, such as resistors.

Like the other memory cells, memory cell 700 includes a pair of inverters, 711 and 712, coupled front-to-back at data nodes A and B. Data nodes A and B are coupled to bit lines 731 and 732, respectively, through corresponding transfer transistors 721 and 722. The gates of transistors 721 and 722 are coupled to word line 740.

Memory cell 700 includes a switchable bit-line-to-ground coupling mechanism on each side of the cell. Bit line 732 is coupled to ground through serially configured transistors 751 and 752. The gate of transistor 751 is connected to word line 740 through delay element 753 so that it is switched on slightly after the voltage on word line 740 goes high and is switched off slightly after the voltage on word line 740 goes low. The gate of transistor 752 is connected to data node A so that it is switched on when the voltage at this node is high and switched off when the voltage at this node is low.

Memory cell 700 is symmetric and includes an identical structure on the other side of the cell. Bit line 731 is coupled to ground through a pair of serially connected transistors, 761 and 762. The gate of transistor 761 is connected to word line 740 through delay element 763. Transistor 761 is therefore switched line slightly after the voltage on word line 740 goes high and is switched off slightly after the voltage on word line 740 goes low. The gate of transistor 762 is connected to data node B, and is therefore switched on when the voltage at node B is high and switched off when the voltage at node B is low.

The bit-line-to-ground coupling mechanisms improve the stability of memory cell 700 in the same manner as memory cell 400. Thus, during a read operation, if one of the bit lines is coupled to the data note that is at a low voltage, the bit line is pulled down, not only by the low voltage at the data note, but also by the coupling to ground through the additional transistors (since one of the transistors is switched on by the asserted signal on the word line and the other transistor is switched on by the high voltage at the opposing data node.) Further, because the bit line is being pulled down by the coupling to ground, the bit line pulls up less strongly on the data node, so the data stored in the cell is less likely to be corrupted.

Many alternative embodiments are possible. For example, rather than coupling the bit line to ground through an NMOS transistor that is switched on and off by the voltage at the opposing data node, a PMOS transistor could be used. The PMOS transistor is switched on and off by the opposite signals, so this transistor would be coupled to and controlled by the voltage at the data node on the same side of the cell, rather than the opposing side.

In another example, just as the one-sided mechanism implemented in SRAM cell 300 was extended to the two-sided mechanism implemented in cell 400, the one-sided mechanism of SRAM cell 500 could be extended to a two-sided implementation. It is also apparent that, just as the bit-line-to-ground mechanisms described above were implemented in a simple, six-transistor SRAM cell and a more complex, dual-port SRAM cell, these mechanisms could be implemented in various other memory cell structures, including SRAM and other types of memory cells.

Those of skill in the art will understand that information and signals may be represented using any of a variety of different technologies and techniques. For example, data, information, signals, bits, etc. that may be referenced throughout the above description may be represented by voltages, currents, or the like. The information and signals may be communicated between components using any suitable transport media, including wires, metallic traces, vias, and so on.

Those of skill will further appreciate that the various illustrative logical blocks, modules, circuits, and algorithm steps described in connection with the embodiments disclosed herein may, in some embodiments, be implemented as electronic hardware, computer software, or combinations of both. To illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), discrete gates or transistor logic, discrete hardware components, general purpose processors, digital signal processors (DSPs) or other logic devices, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

What is claimed is:

1. A memory cell comprising:

a first data node switchably coupled to a first bit line; and a second data node switchably coupled to a second bit line;

wherein the memory cell is configured to be read by coupling the first data node to the first bit line and coupling the second data node to the second bit line to enable a low voltage at one of the data nodes to pull down the corresponding bit line:

wherein the first bit line is switchably coupled to a first low voltage;

wherein when the memory cell is read, the first bit line is coupled to the first low voltage when a voltage at the second data node is high and decoupled from the first low voltage when the voltage at the second data node is low wherein a plurality of transistors that form the memory cell have nominally the same threshold voltage but have high threshold voltage variations.

2. The memory cell of claim 1, further comprising first and second transistors serially coupled between the first bit line and the first low voltage, wherein the first transistor is switched on when the voltage at the second data node is high and switched off when the voltage at the second data node is low wherein the second transistor is switched on when the voltage on a word line is high and switched off when the voltage on the word line is low.

3. A memory cell comprising:

a first data node switchably coupled to a first bit line, and a second data node switchably coupled to a second bit line, wherein the memory cell is configured to be read by coupling the first data node to the first bit line and coupling the second data node to the second bit line to enable a low voltage at one of the data nodes to pull down the corresponding bit line, wherein the first bit line is switchably coupled to a first low voltage, and wherein when the memory cell is read, the first bit line is coupled to the first low voltage when a voltage at the second data node is high and decoupled from the first low voltage when the voltage at the second data node is low;

first and second transistors serially coupled between the first bit line and the first low voltage, wherein the first transistor is switched on when the voltage at the second data node is high and switched off when the voltage at the second data node is low, and wherein the second transistor is switched on when the voltage on a word line is high and switched off when the voltage on the word line is low; and a first delay element coupled between the second transistor and the word line to cause the second transistor to be switched on at a first delay after the voltage on the word line goes high and switched off at a first delay after the voltage on the word line goes low.

4. The memory cell of claim 3, wherein the first delay element comprises a resistor.

5. The memory cell of claim 1, wherein the second bit line is switchably coupled to a second low voltage and wherein when the memory cell is read, the second bit line is coupled to the second low voltage when a voltage at the first data node is high and decoupled from the second low voltage when the voltage at the first data node is low.

6. The memory cell of claim 5, further comprising third and fourth transistors serially coupled between the second bit line and the second low voltage, wherein the third transistor is switched on when the voltage at the first data node is high and switched off when the voltage at the first data node is low wherein the fourth transistor is switched on when the voltage on a word line is high and switched off when the voltage on the word line is low.

7. A memory cell comprising;

a first data node switchably coupled to a first bit line, and a second data node switchably coupled to a second bit line, wherein the memory cell is configured to be read by coupling the first data node to the first bit line and coupling the second data node to the second bit line to enable a low voltage at one of the data nodes to pull down the corresponding bit line, wherein the first bit line is switchably coupled to a first low voltage, and wherein when the memory cell is read, the first bit line is coupled to the first low voltage when a voltage at the second data node is high and decoupled from the first low voltage when the voltage at the second data node is low, wherein the second bit line is switchably coupled to a second low voltage and wherein when the memory cell is read, the second bit line is coupled to the second low voltage when a voltage at the first data node is high and decoupled from the second low voltage when the voltage at the first data node is low;

third and fourth transistors serially coupled between the second bit line and the second low voltage, wherein the third transistor is switched on when the voltage at the second data node is high and switched off when the voltage at the second data node is low, and wherein the fourth transistor is switched on when the voltage on a word line is high and switched off when the voltage on the word line is low, and a second delay element coupled between the fourth transistor and the word line to cause the fourth transistor to be switched on at a second delay after the voltage on the word line goes high and switched off at a second delay after the voltage on the word line goes low.

8. The memory cell of claim 7, wherein the second delay element comprises a resistor.

9. The memory cell of claim 1, further comprising a first transistor, wherein the first bit line is switchably coupled to the first low voltage by the first transistor and wherein the first transistor is switched on when the voltage at the second data node is high and switched off when the voltage at the second data node is low.

10. The memory cell of claim 9, further comprising a second transistor, wherein the first bit line is switchably coupled to the first low voltage serially through the first transistor and the second transistor and wherein the second transistor is switched on when the memory cell is read.

11. The memory cell of claim 9, further comprising a first inverter and a second inverter, wherein the input of the first inverter and the output of the second inverter are connected to the first data node and wherein the input of the second inverter and the output of the first inverter are connected to the second data node.

12. The memory cell of claim 11, further comprising a first transfer transistor coupled between the first data node and the first bit line and a second transfer transistor coupled between the second data node and the second bit line.

13. The memory cell of claim 12, further comprising a word line connected to the gates of the transfer transistors, wherein the transfer transistors are switched on when a read signal is asserted on the word line.

14. The memory cell of claim 13, further comprising a second transistor, wherein the first bit line is switchably coupled to the first low voltage serially through the first transistor and the second transistor and wherein the second transistor is switched on when the memory cell is read.

15. The memory cell of claim 1, wherein the memory cell comprises a SRAM memory cell.

16. The memory cell of claim 1, wherein the memory cell comprises a dual-port memory cell.

17. A method implemented in a memory cell comprising:

providing a memory cell having a first data node switchably coupled to a first bit line and a second data node switchably coupled to a second bit line, wherein the memory cell is configured to be read by enabling a low voltage at one of the data nodes to pull down the corresponding bit line and wherein a plurality of transistors that form the memory cell have nominally the same threshold voltage but have high threshold voltage variations;

switchably coupling the first bit line to a first low voltage; and when the memory cell is read, coupling the first bit line to the first low voltage when the second data node is high and decoupling the first bit line from the first low voltage when the second data node is low.

18. A method implemented in a memory cell comprising;

providing a memory cell having a first data node switchably coupled to a first bit line and a second data node switchably coupled to a second bit line, wherein the memory cell is configured to be read by enabling a low voltage at one of the data nodes to pull down the corresponding bit line;

switchably coupling the first bit line to a first low voltage; and when the memory cell is read, coupling the first bit line to the first low voltage with a first delay after the second data node goes high and decoupling the first bit line from the first low voltage with the first delay after the second data node goes low.

19. The method of claim 17, further comprising switchably coupling the second bit line to a second low voltage; and when the memory cell is read, coupling the second bit line to the second low voltage when the first data node is high and decoupling the second bit line from the second low voltage when the first data node is low.

20. A method implemented in a memory cell comprising:

providing a memory cell having a first data node switchably coupled to a first bit line and a second data node switchably coupled to a second bit line, wherein the memory cell is configured to be read by enabling a low voltage at one of the data nodes to pull down the corresponding bit line;

switchably coupling the first bit line to a first low voltage, wherein when the memory cell is read, the first bit line is coupled to the first low voltage when the second data node is high and the first bit line is decoupled from the first low voltage when the second data node is low;

switchably coupling the second bit line to a second low voltage, wherein when the memory cell is read, the second bit line is coupled to the second low voltage with a second delay after the first data node goes high and the second bit line is decoupled from the second low voltage with the second delay after the first data node goes low.

21. The method of claim 17, wherein coupling the first bit line to the first low voltage comprises switching on a pair of transistors that are coupled in series between the first bit line and the first low voltage.

22. The method of claim 17, wherein decoupling the first bit line from the first low voltage comprises switching off one of a pair of transistors that are coupled in series between the first bit line and the first low voltage.

23. The method of claim 17, wherein switchably coupling the first bit line to the first low voltage comprises connecting one or more transistors in series between the first bit line and the first low voltage, wherein coupling the first bit line to the first low voltage comprises switching on all of the one or more transistors and decoupling the first bit line to the first low voltage comprises switching off at least one of the one or more transistors.

24. The method of claim 23, wherein switchably coupling the first bit line to the first low voltage comprises connecting two transistors in series between the first bit line and the first low voltage.

25. The method of claim 24, wherein switchably coupling the first bit line to the first low voltage further comprises switching on a first one of the transistors when the second data node is high and switching on a second one of the transistors when a read operation is in progress.

26. The method of claim 17, wherein providing the memory cell comprises providing an SRAM memory cell.

27. The method of claim 17, wherein providing the memory cell comprises providing a dual-port memory cell.

28. A memory cell comprising:

first and second inverters, wherein the input of the first inverter and the output of the second inverter are coupled to a first data node and wherein the output of the first inverter and the input of the second inverter are coupled to a second data node;

first and second bit lines;

first and second transfer transistors, wherein the first transfer transistor is coupled between the first data node and the first bit line, wherein the second data transfer transistor is coupled between the second data node and the second bit line, and wherein the first and second transfer transistors are coupled to a word line and configured to be switched on and off by a signal on the word line; and a first pair of additional transistors, wherein the first pair of additional transistors is serially coupled between the second bit line and a predetermined voltage, wherein a first of one of the first pair of additional transistors is coupled to the word line and configured to be switched on and off by the signal on the word line, and wherein a second one of the first pair of additional transistors is coupled to the first data node and configured to be switched on and off by a voltage at the first data node;

wherein the plurality of transistors that form the memory cell have nominally the same threshold voltage but have high threshold voltage variations.

* * * * *